(12) United States Patent
Allman et al.

(10) Patent No.: US 6,576,544 B1
(45) Date of Patent: Jun. 10, 2003

(54) LOCAL INTERCONNECT

(75) Inventors: Derryl D. J. Allman, Camas, WA (US); James R. Hightower, Fort Collins, CO (US); Phonesavanh Saopraseuth, Gresham, OR (US)

(73) Assignee: LSI Logic Corporation, Milpitas, CA (US)

( * ) Notice: Subject to any disclaimer, the term of this patent is extended or adjusted under 35 U.S.C. 154(b) by 90 days.

(21) Appl. No.: 09/966,464

(22) Filed: Sep. 28, 2001

(51) Int. Cl.$^7$ .................. H01L 21/4763; H01L 21/44
(52) U.S. Cl. ........................... 438/622; 438/687
(58) Field of Search .................. 438/618, 622, 438/624, 625, 637, 642, 648, 686, 687; 257/758, 759, 762

(56) References Cited

U.S. PATENT DOCUMENTS

| | | | |
|---|---|---|---|
| 5,219,791 A | * | 6/1993 | Freiberger |
| 5,302,551 A | * | 4/1994 | Iranmanesh et al. |
| 5,366,906 A | * | 11/1994 | Wojnarowski et al. |
| 5,498,569 A | * | 3/1996 | Eastep |
| 5,576,240 A | | 11/1996 | Radosevich et al. ......... 437/60 |
| 6,069,051 A | | 5/2000 | Nguyen et al. ............. 438/396 |
| 6,140,198 A | * | 10/2000 | Liou |
| 6,223,432 B1 | * | 5/2001 | Dennison et al. |

FOREIGN PATENT DOCUMENTS

| | | | | |
|---|---|---|---|---|
| EP | 358879 A2 | * | 3/1990 | ........ H01L/23/485 |
| EP | 497595 A2 | * | 8/1992 | ........ H01L/21/285 |
| EP | 517368 A2 | * | 12/1992 | ....... H01L/21/3205 |
| WO | WO 97/06560 | * | 2/1997 | .......... H01L/23/48 |

* cited by examiner

Primary Examiner—Olik Chaudhuri
Assistant Examiner—Brook Kebede
(74) Attorney, Agent, or Firm—Luedeka, Neely & Graham

(57) ABSTRACT

A method for forming the electrical interconnect levels and circuit elements of an integrated circuit is provided by the present invention. The method utilizes a relatively thin layer of conductive material having a higher resistance than the metal typically used to form electrical interconnections, such as titanium nitride, to provide relatively short local interconnections between circuit elements of the integrated circuit. In addition, this same thin layer of conductive material is used to form macro elements such as capacitors, resistors, and fuses in the integrated circuit. By allowing the removal of space consuming transverse electrical interconnect lines from the interconnect levels, the present invention increases the routing density of the electrical interconnect levels. Furthermore, by allowing these local electrical interconnections to be produced during the same manufacturing step as the macro elements of the integrated circuit, the method of the present invention tends to reduce the number of steps required to produce an integrated circuit.

18 Claims, 2 Drawing Sheets

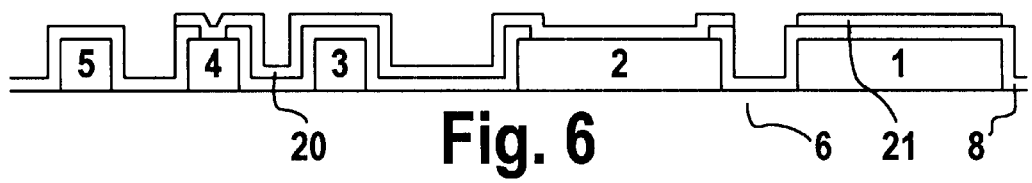
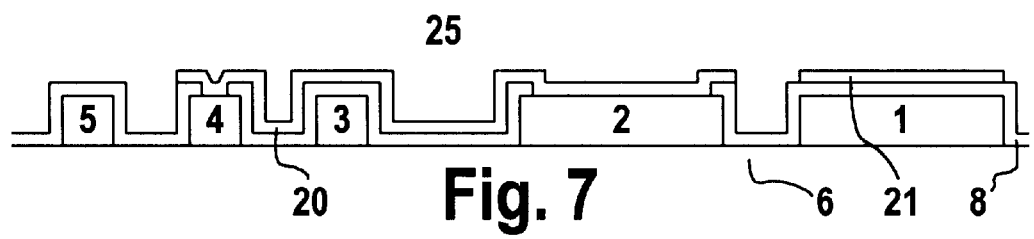
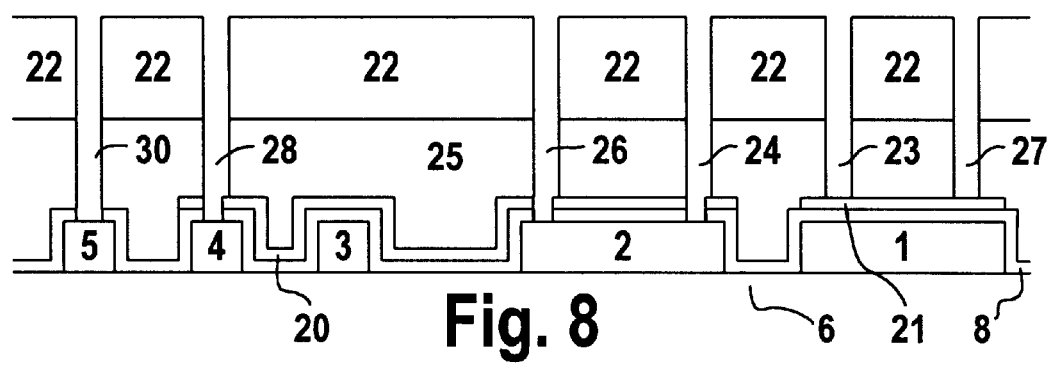
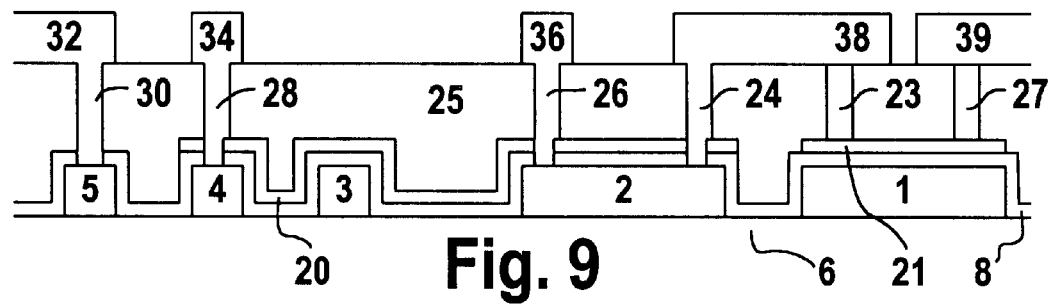

LOCAL INTERCONNECT

FIELD OF THE INVENTION

This invention generally relates to the field of integrated circuit manufacturing. More particularly, this invention relates to an improved method for constructing an integrated circuit whereby the routing density of electrically conductive interconnects on any particular interconnect layer is generally increased, and the overall number of interconnect layers required for a particular integrated circuit is generally decreased.

BACKGROUND

Integrated circuits are typically formed of layers of electrically semiconducting materials, electrically insulating materials, and electrically conducting materials that are layered in a complex series of processes such as doping, deposition, and etching of the materials in progressive layers. Typically, the various circuit elements within the integrated circuit are electrically connected using layers of the electrically conductive material, such as metal. These layers of electrically conductive material are usually patterned into interconnects. Several layers of interconnects may be used in the fabrication of a completed integrated circuit. Typically, each level of interconnects in an integrated circuit runs primarily in either the X or Y direction to allow for the electrical connection of the transistors and the macro elements that form an integrated circuit.

Sometimes it is desirable for two or more elements disposed on an X direction interconnect level, for example, to be electrically connected in a Y direction. In this manner, an electrical connection can be made between two or more elements that are in close proximity to one another, without requiring the connection to be made on a different level of electrical interconnects, which may reduce the total number of interconnect layers. However, when such a transverse electrical connection is made, it typically requires that no other electrical connections can be made in the area of the transverse electrical connection. In other words, it is typically preferred that none of the electrical interconnections within a single layer cross, or the electrical interconnections create a mass of short circuited connections. Thus, the use of a short transverse electrical connection tends to reduce the density of the electrical interconnect layer in which it is used.

The macro elements within an integrated circuit, such as resistors, fuses, and capacitors, are also constructed utilizing electrically conductive materials and other materials. However, the electrical properties of the conductive materials used for the macro elements are somewhat different from the electrical properties of the conductive materials used for the electrical interconnect layers. For example, the bulk resistance of the electrically conductive material used to form the macro elements is often much greater than that which is desirable for use in the electrical interconnect layers. One reason for this is that many of the macro elements are designed to be resistive elements or are otherwise not designed to carry an appreciable amount current for any significant distance. However, the electrical interconnect layers, on the other hand, are primarily designed to carry an appreciable amount of current for a significant distance, and preferably without a significant voltage drop. Therefore, the desired electrical properties of the different electrically conductive materials used for the macro elements and the electrical interconnect layers tend to be mutually exclusive.

Therefore, what is needed is an improved method of manufacturing integrated circuits that generally increases the routing density of the interconnect layers and generally decreases the overall number of interconnect layers.

SUMMARY

The above and other needs are met by a method for forming an electrically conductive local interconnection between circuit elements of an integrated circuit. A first layer of conductive material is deposited on a substrate. This conductive material has a relatively low bulk electrical resistance. A pattern is etched out of the first layer of conductive material to form a first conductive circuit layer having first conductive elements on the substrate. A first layer of insulating material, preferably a silicon oxide such as silicon dioxide, is deposited on top of the first conductive circuit layer.

In an alternate embodiment, the first insulating layer is a layer of high density plasma oxide that is deposited such that the layer of high density plasma oxide fills in gaps between the first conductive circuit elements. After deposition, the first layer of insulating material is patterned to form local interconnection points on a least two of the first conductive elements such that the local interconnection points are within a predetermined distance of each other. A second layer of conductive material is deposited over the patterned first layer of insulating material. This second layer of conductive material has a relatively high bulk resistance as compared to the first layer of conductive material.

The second layer of conductive material is preferably a layer of titanium nitride that is between about one hundred angstroms and about five thousand angstroms in thickness. This second layer of conductive material is patterned to form the electrically conductive local interconnection between the at least two of the first conductive elements. The second layer of conductive material is also used to form portions of macro circuit elements that are designed to function with the relatively high bulk electrical resistance of the second layer of conductive material. These macro circuit elements may include circuit elements such as capacitor electrodes, resistors and fuses.

A second insulating layer is deposited over the second layer of conductive material, and preferably planarized. Vias are etched in the second layer of insulating material to provide electrical connection points to the electrically conductive local interconnections and the first conductive elements. Finally, a third layer of conductive material having a relatively low bulk resistance is deposited over the second insulating layer and patterned such that the vias provide electrical interconnections between the patterned first layer of conductive material, the second layer of conductive material and the patterned third layer of conductive material.

The present invention tends to decrease the complexity and increase the routing density of the interconnect levels by removing some of the interconnect lines from the interconnect levels through the use of relatively short conductive local interconnections constructed from a conductive material that has a resistance that is higher than the conductive material typically used to form the interconnect levels. The material used to form the local electrical interconnections is the same material used to form macro circuit elements such as resistors, capacitor electrodes, and fuses and is applied during the same manufacturing process used to form these macro circuit elements. By producing these local conductive interconnects during the same manufacturing step used to produce the macro circuit elements, the method of the present invention tends to reduce the total number of steps required to produce an integrated circuit. Thus, the present invention tends to reduce the cost of constructing an integrated circuit.

In another embodiment, the present invention is directed toward a method of forming an electrically conductive local interconnect on an integrated circuit. A first layer of conductive material is deposited on a substrate, where the first layer of conductive material has a relatively low bulk electrical resistance. The first layer of conductive material is patterned to form a first conductive circuit layer on the substrate, where the first conductive circuit layer has first conductive elements. A first layer of insulating material is deposited on top of the first conductive circuit layer.

A second layer of conductive material is deposited over the first layer of insulating material, where the second layer of conductive material has a relatively high bulk electrical resistance. The second layer of conductive material is patterned to form the electrically conductive local interconnect between at least two of the first conductive elements in the first conductive circuit layer, and also to form portions of macro elements. The macro elements are designed to function with the relatively high bulk electrical resistance of the second layer of conductive material.

A second layer of insulating material is deposited over the second layer of conductive material. Vias are etched through the second layer of insulating material and the first layer of insulating material to simultaneously contact the second layer of conductive material and the first conductive circuit layer. The local interconnection points are within a predetermined distance of each other. The vias provide electrical connection points between the electrically conductive local interconnect and the at least two of the first conductive elements.

A third layer of conductive material having a relatively low bulk resistance is deposited and patterned over the second layer of insulating material to provide electrical interconnections at the electrical connection points between the electrically conductive local interconnect and the at least two of the first conductive elements.

Similar to that as described above, this method provides for the formation of a electrically conductive local interconnect without substantial additional processing. The local interconnect is formed using a conductive layer, such as a metal layer, that is typically used for the formation of macro elements such as capacitor electrodes, resistors, and fuses. Thus, the local interconnect is preferably short enough, or in other words the predetermined distance mentioned above is preferably short enough, such that the higher bulk resistance of the second conductive layer does not substantially impede the proper functioning of the local interconnect. Thus, the local interconnect is formed at the same time that the macro elements are formed, and an additional processing step is not required to form the local interconnect. It is appreciated, however, that a mask change preferably adds the local interconnect to the macro element formation mask.

This second method differs from the first method in that the insulating layer between the bottom conductive layer, typically a bottom metal layer, is not patterned prior to deposition of the local interconnect layer. Thus, in this embodiment the local interconnect layer does not make electrical contact with the first conductive layer at the time that the local interconnect layer is deposited. However, at a later point in the method, vias are formed through, or at least contacting an edge of, the local interconnect layer and then down past the local interconnect layer to those elements of the first conductive layer that are to be electrically connected via the local interconnect. When the third conductive layer, typically a metal, is deposited in the vias, the third conductive material contacts both the local interconnect and the first conductive elements, thus forming the electrical connections between them, and also forming electrical connections to circuit structures at higher levels of the integrated circuit.

BRIEF DESCRIPTION OF THE DRAWINGS

Further advantages of the invention are apparent by reference to the detailed description when considered in conjunction with the figures, which are not to scale so as to more clearly show the details, wherein like reference numbers indicate like elements throughout the several views, and wherein:

FIG. 6 is a cross sectional view of a local interconnect formed from the second electrically conductive layer shown in FIG. 5, which local interconnect contacts the first electrically conductive layer through the patterned first insulating layer, FIG. 7 is a cross sectional view of a second insulating layer formed over a local interconnect that does not yet electrically contact the first electrically conductive layer, because the first insulating layer has not been patterned, FIG. 8 is a cross sectional view of a layer of photoresist material for etching vias through the second insulating layer, local interconnect, and first insulating layer of FIG. 7, and FIG. 9 is a cross sectional view of a third electrically conductive layer forming electrical connections in the vias between the local interconnect and first electrically conductive layer of FIG. 8.

DETAILED DESCRIPTION

Figure 1:
FIG. 1 is a cross sectional view of an integrated circuit substrate with a patterned first conductive material layer.

With regard to FIG. 1, the preferred method of constructing an integrated circuit in accordance with the present invention begins with the formation of a first conductive circuit layer on a substrate 6. The substrate 6 represents layers of the integrated circuit that lie below the first conductive layer. These layers may take many different forms, but a detailed recitation of their description is not necessary for an understanding of the present invention. The first conductive circuit layer is preferably patterned to form first conductive elements, such as elements 1, 2, 3, 4, and 5. The first conductive layer is preferably formed of a conductive material that has a relatively low bulk electrical resistance. Most preferably the first conductive layer is formed of a metal such as gold, copper, or aluminum, or a composite stack of layers of several conductive materials. Thus, a primary purpose of the first conductive circuit layer is to carry electrical charges without significant electrical resistance or ohmic losses. Therefore, the bulk electrical resistance of the first conductive layer is preferably relatively low.

It is appreciated that the first electrically conductive layer as described above may not be the first conductive layer that is deposited on the substrate 6. The substrate 6 as defined herein may already have conductive layers below the first conductive layer. Thus, the first conductive layer as described herein is so designated because it is the first conductive layer that is described in conjunction with the present invention.

Figure 2:
FIG. 2 is a cross sectional view of a first insulating layer deposited on the integrated circuit substrate and patterned first conductive material layer shown in FIG. 1.

A first insulating layer 8 is deposited over the first conductive elements 1, 2, 3, 4, and 5, as depicted in FIG. 2. In a preferred embodiment the first insulating layer 8 is a silicon oxide, such as silicon dioxide. The first insulating layer 8 is preferably formed at a thickness of from about fifty angstroms to several thousand angstroms. In one embodiment of the present invention, the insulating layer 8 consists of a high density plasma oxide that is deposited over the first conductive elements 1, 2, 3, 4, and 5. The high density plasma oxide substantially fills in the gaps between the first conductive elements 1, 2, 3, 4, and 5.

Figure 3:
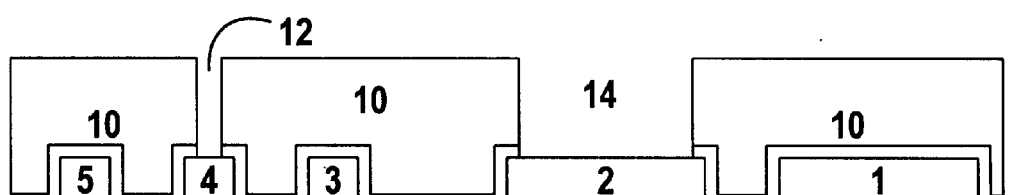
FIG. 3 is a cross sectional view of a photoresist mask for etching the first insulating layer shown in FIG. 2.

Referring now to FIG. 3, a photoresist mask 10 is applied over the structure of FIG. 2. An etch process removes portions 12 and 14 of the insulating layer 8 where it is desired to make electrical connections to the first conductive elements 2 and 4. It is appreciated that the number of first conductive elements exposed in this step is representational only, and that in actual practice, more than two of the first conductive elements may be exposed during this step. Once the first insulating layer is removed from the selected areas 12 and 14, the photoresist mask 10 is removed from the remaining portions of the first insulating layer 8.

Figure 4:
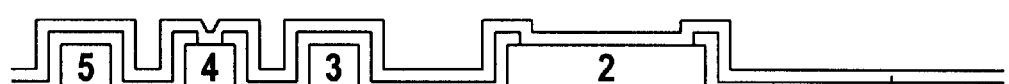
FIG. 4 is a cross sectional view of a second electrically conductive layer deposited on the etched first insulating layer shown in FIG. 3.

As depicted in FIG. 4, a second conductive layer 16 is deposited over the first insulating layer 8. The second conductive layer 16 is preferably formed of an electrically conductive material having a relatively high bulk resistance. It is appreciated that the designations of relatively low bulk resistance and relatively high bulk resistance are in regard both one to another, and also as to the intended purpose for the conductive layer so designated. The high bulk resistance materials are preferably of the refractory family of materials, which tend to exhibit good electromigration results so that a thin film can conduct current present in the low bulk resistance structures.

The second conductive layer 16 is preferably formed of titanium nitride, titanium, or some other such material. The second conductive layer 16 preferably ranges in thickness from about one hundred angstroms to about five thousand angstroms. Titanium nitride is typically considered to have too high of a resistance to use for the interconnect levels of an integrated circuit. However, it has been discovered that a higher resistance material typically used to form macro elements such as capacitor electrodes, resistors, or fuses can also be used to form relatively short local interconnects between circuit elements that are positioned close to one another in an integrated circuit. The macro element to be formed (such as element 21 depicted in FIG. 6) tends to influence the desired thickness of the second conductive layer 16. For example the second conductive layer 16 may be about four hundred and fifty angstroms thick when a capacitor electrode is to be formed in the second conductive layer 16, and about fifty angstroms thick when a fuse is to be formed in the second conductive layer 16.

Since the higher resistance material is only used to form relatively short local interconnects, the voltage drop caused by the higher resistance of the material is reduced to a level where it does not substantially impair the proper function of the local interconnects. For example, the second conductive layer 16 shown in FIG. 4 forms a short local interconnect between the first conductive elements 2 and 4. The maximum length of the first predetermined distance between which the local interconnect is to be formed is based at least in part on the electrical properties desired for the local interconnect, and thus tends to vary from one application to another. Since the second conductive layer 16 can be used to form some of the previously discussed transverse interconnects that would otherwise decrease the routing density of traditionally constructed interconnect layers, the routing density of the interconnect layers can remain at an unimpaired level.

Figure 5:
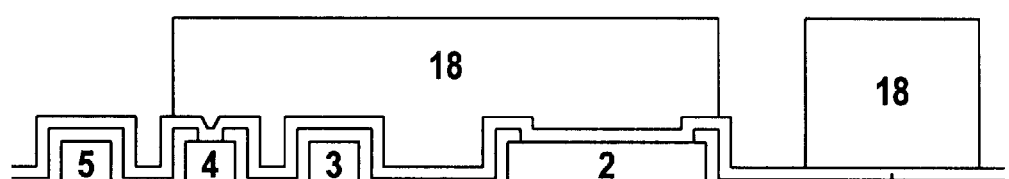
FIG. 5 is a cross sectional view of a photoresist mask for patterning the second electrically conductive layer shown in FIG. 4.

Once the second conductive layer 16 is deposited as depicted in FIG. 4, it is covered with a mask of photoresist material 18 as shown in FIG. 5. The second conductive layer 16 is then etched and the photoresist material is removed to produce the circuit of FIG. 6 that has the local interconnect 20 formed between the first conductive elements 2 and 4, and a macro element 21. The macro element 21, as mentioned above, may be an element such as a capacitor electrode, resistor, or fuse. It is appreciated that the original primary purpose of the second conductive layer 16 and the mask layer used to form the local interconnect 20 is to form the macro element 21, but in this method the second conductive layer 16 and the mask layer are also used to form the local interconnect 20. Thus, the local interconnect 20 is formed without an additional conductive layer and associated masking process. Processing of the integrated circuit then s proceeds after this point to a standard conclusion.

FIGS. 7–9 depict an alternate embodiment of the method for forming the local interconnect 20, and an alternate embodiment of the local interconnect 20 itself. The integrated circuit of FIG. 7 is constructed in a similar manner as the integrated circuit of FIGS. 1–6, except that the first insulating layer 8 is not etched as shown in FIG. 3. The other steps as described above are preferably the same. Thus, the first conductive elements 2, 3, and 4 underlie the second conductive layer 16, but do not make electrical contact with the second conductive layer 16 at this point in the processing.

As shown in FIG. 7, but present in either embodiment, a second insulating layer 25 is deposited over the entire integrated circuit. This second insulating layer 25 is preferably formed of a silicon oxide, such as silicon dioxide. However, this layer may at times be formed of a material having a different dielectric constant than that of layer 20, where layer 20 may be intended to be part of a capacitor. The second insulating layer 25 provides electrical insulation between the first conductive elements 1, 2, 3, 4, and 5 of the first conductive layer and the elements of subsequent conductive layers.

In FIG. 8, a via mask 22 is used to etch vias in the underlying layers, such as vias 23, 24, 26, 27, 28 and 30. The vias 24, 26 and 28 are preferably etched through the second insulating layer 25, and the first insulating layer 8 to contact the first conductive elements 2 and 4. Thus, the vias 24, 26 and 28 contact the local interconnect 20. Although the via 30 is also etched down through the second insulating layer 25 and the first insulating layer 8 to expose the first conductive element 5, the local interconnect 20 does not extend over to the first conductive element 5 in this example, and thus the via 30 does not contact the local interconnect 20. It is appreciated that the specific ones of the first conductive elements 1, 2, 3, 4, and 5 that are exposed in this manner are by way of example only, and that in actual practice, a different number and selection of the first conductive elements 1, 2, 3, 4, and 5 may be so exposed in the via etch process.

The vias 23, 24, 26, 27, 28 and 30 are filled with a third conductive material to provide electrical connections within the vias. The third conductive material is preferably a stack of layers of different conductive materials, but preferably the bulk resistance of the third conductive material is relatively low, with a meaning as explained above, so that the third conductive material can carry electrical charges without substantial ohmic losses. For example, in one embodiment a thin titanium liner layer is first deposited as an adhesion layer and as a gettering layer. A thin titanium nitride liner layer is then deposited as a barrier layer to protect the underlying layers during subsequent processing. Finally, a conductive tungsten plug is deposited to completely fill the vias 23, 24, 26, 27, 28 and 30.

Referring now to FIG. 9, once the via mask 22 is removed and the vias 23, 24, 26, 27, 28, and 30 are filled with the third conductive material, the electrical connections between the first conductive elements 2 and 4 and the local interconnect 20 are made. Preferably, the third layer of conductive material, or an additional layer, forms contacts 32, 34, 36, 38, and 39 on the second insulating layer 25. Thus, FIGS. 7–9 depict an alternate process whereby short local electrical interconnects are formed at the same time as macro circuit elements and the via connections between interconnect layers of an integrated circuit are formed.

The foregoing description of preferred embodiments for this invention have been presented for purposes of illustration and description. They are not intended to be exhaustive or to limit the invention to the precise form disclosed. Obvious modifications or variations are possible in light of the above teachings. The embodiments are chosen and described in an effort to provide the best illustrations of the principles of the invention and its practical application, and to thereby enable one of ordinary skill in the art to utilize the invention in various embodiments and with various modifications as is suited to the particular use contemplated. All such modifications and variations are within the scope of the invention as determined by the appended claims when interpreted in accordance with the breadth to which they are fairly, legally, and equitably entitled.

What is claimed is:

1. A method for forming an electrically conductive local interconnect on an integrated circuit, the method comprising the steps of:
    depositing a first layer of conductive material on a substrate, wherein the first layer of conductive material has a relatively low bulk electrical resistance,
    patterning the first layer of conductive material to form a first conductive circuit layer on the substrate, the first conductive circuit layer having first conductive elements,
    depositing a first layer of insulating material on top of the first conductive circuit layer,
    patterning the first layer of insulating material to selectively expose local interconnection points on at least two of the first conductive elements in the first conductive circuit layer, wherein the local interconnection points are within a predetermined distance of each other,
    depositing a second layer of conductive material over the patterned first layer of insulating material, wherein the second layer of conductive material has a relatively high bulk electrical resistance, and
    patterning the second layer of conductive material to form the electrically conductive local interconnect between the at least two of the first conductive elements in the first conductive circuit layer, and to also form portions of macro elements, which macro elements are designed to function with the relatively high bulk electrical resistance of the second layer of conductive material.

2. The method of claim 1 wherein portions of the macro elements comprises portions of at least one of a resistor, a capacitor electrode, and a fuse.

3. The method of claim 1 wherein the step of patterning the local interconnection points within the predetermined distance of each other comprises patterning the local interconnection points within a distance that does not create a resistance within the electrically conductive local interconnect between the local interconnection points that is too great for the local interconnect to function properly.

4. The method of claim 1 wherein the step of depositing a second layer of conductive material comprises depositing a layer of titanium nitride.

5. The method of claim 4 wherein the layer of titanium nitride is deposited to a thickness of between about one hundred angstroms and about five thousand angstroms.

6. The method of claim 1 wherein the step of depositing the first layer of insulating material comprises depositing silicon oxide.

7. The method of claim 1 wherein the step of depositing the first layer of insulating material comprises depositing silicon oxide with a high density plasma process such that the silicon oxide fills in gaps between the conductive elements of the first layer of patterned conductive material.

8. The method of claim 1 further comprising depositing a second layer of insulating material over the second layer of conductive material.

9. The method of claim 8 further comprising planarizing the second layer of insulating material.

10. The method of claim 9 further comprising etching vias in the second layer of insulating material to provide electrical connection points to the electrically conductive local interconnect and the first layer of patterned conductive material.

11. The method of claim 10 further comprising depositing and patterning a third layer of conductive material having a relatively low bulk resistance over the second layer of insulating material to provide electrical interconnections between the electrical connection points and the third layer of patterned conductive material.

12. A method for forming an electrically conductive local interconnect on an integrated circuit, the method comprising the steps of:
    depositing a first layer of conductive material on a substrate, wherein the first layer of conductive material has a relatively low bulk electrical resistance,
    patterning the first layer of conductive material to form a first conductive circuit layer on the substrate, the first conductive circuit layer having first conductive elements,
    depositing a first layer of insulating material on top of the first conductive circuit layer,
    depositing a second layer of conductive material over the first layer of insulating material, wherein the second layer of conductive material has a relatively high bulk electrical resistance,
    patterning the second layer of conductive material to form the electrically conductive local interconnect between at least two of the first conductive elements in the first conductive circuit layer, and to also form portions of macro elements, which macro elements are designed to function with the relatively high bulk electrical resistance of the second layer of conductive material, depositing a second layer of insulating material over the second layer of conductive material, etching vias through the second layer of insulating material and the first layer of insulating material to selectively expose local interconnection points on the at least two of the first conductive elements in the first conductive circuit layer, wherein the local interconnection points are within a predetermined distance of each other, and to provide electrical connection points between the electrically conductive local interconnect and the at least two of the first conductive elements, and depositing and patterning a third layer of conductive material having a relatively low bulk resistance over the second layer of insulating material to provide electrical interconnections at the electrical connection points between the electrically conductive local interconnect and the at least two of the first conductive elements.

13. The method of claim 12 wherein portions of the macro elements comprises portions of at least one of a resistor, a capacitor electrode, and a fuse.

14. The method of claim 12 wherein the step of patterning the local interconnection points within the predetermined distance of each other comprises patterning the local interconnection points within a distance that does not create a resistance within the electrically conductive local interconnect between the local interconnection points that is too great for the local interconnect to function properly.

15. The method of claim 12 wherein the step of depositing a second layer of conductive material comprises depositing a layer of titanium nitride.

16. The method of claim 12 wherein the layer of titanium nitride is deposited to a thickness of between about one hundred angstroms and about five thousand angstroms.

17. The method of claim 12 wherein the step of depositing the first layer of insulating material comprises depositing silicon oxide.

18. The method of claim 12 wherein the step of depositing the first layer of insulating material comprises depositing silicon oxide with a high density plasma process such that the silicon oxide fills in gaps between the conductive elements of the first layer of patterned conductive material.

* * * * *